(12) United States Patent
Stephenson et al.

(10) Patent No.: US 7,376,007 B2
(45) Date of Patent: May 20, 2008

(54) NON-VOLATILE MAGNETIC MEMORY DEVICE

(75) Inventors: James Stephenson, Salt Lake City, UT (US); Bruce Shipley, Lee's Summit, MO (US); Dan Carothers, Merrimack, NH (US)

(73) Assignee: Micromem Technologies, Inc., Toronto, Ontario (CA)

( * ) Notice: Subject to any disclaimer, the term of this patent is extended or adjusted under 35 U.S.C. 154(b) by 0 days.

(21) Appl. No.: 11/449,027

(22) Filed: Jun. 8, 2006
(Under 37 CFR 1.47)

(65) Prior Publication Data
US 2006/0285383 A1    Dec. 21, 2006

Related U.S. Application Data

(63) Continuation of application No. 10/039,296, filed on Oct. 19, 2001, now Pat. No. 7,110,312.

(60) Provisional application No. 60/242,396, filed on Oct. 20, 2000.

(51) Int. Cl.
*G11C 11/14* (2006.01)
(52) U.S. Cl. ................. 365/171; 365/209; 365/145; 365/158; 365/170
(58) Field of Classification Search ............. 365/171, 365/209, 145, 158, 170, 207
See application file for complete search history.

(56) References Cited

U.S. PATENT DOCUMENTS

| | | | |
|---|---|---|---|
| 2,911,627 A | * | 11/1959 | Kilburn et al. ............ 365/55 |
| 4,607,271 A | | 8/1986 | Popovic et al. ........... 257/422 |
| 4,791,604 A | | 12/1988 | Lienau et al. ............. 365/53 |
| 4,803,658 A | | 2/1989 | Grimes .................... 658/76 |
| 5,025,416 A | | 6/1991 | Prinz ...................... 365/170 |
| 5,075,247 A | | 12/1991 | Matthews ................. 438/8 |

(Continued)

FOREIGN PATENT DOCUMENTS

GB    2 039 431    8/1980

*Primary Examiner*—Connie C. Yoha
(74) *Attorney, Agent, or Firm*—Morgan, Lewis & Bockius LLP

(57) ABSTRACT

A non-volatile magnetic memory cell having a magnetic element with multiple segments which are not co-linear. Each of the segments is magnetized with a remnant magnetic field using a single write line. The segments can be magnetized in a first direction or a second direction, corresponding to first and second orientations of the memory cell. A sensor is provided to determine the direction in which the segments are magnetized and thereby the orientation of the cell. The segments are oriented such that the magnetic flux fields created by their respective remnant magnetic fields have a cumulative effect at a sensing region of the sensor. The cumulative effect allows a less sensitive sensor to be used than in known device. In various embodiments, the magnetic element can have a number of linear segments or a curved profile. In another embodiment, multiple magnetic elements are magnetized by a single write line. The multiple magnetic elements are arranged such that remnant magnetic field stored in them can be cumulatively sensed. In another embodiment, the magnetic element is arranged to be magnetized in a single general direction, but is shaped such that magnetic flux lines emanate from it in different directions. The different directions are arranged to direct flux lines through the sensing region of a sensor, which measures their cumulative effect.

38 Claims, 11 Drawing Sheets

U.S. PATENT DOCUMENTS

| | | | |
|---|---|---|---|
| 5,289,410 A | 2/1994 | Katti et al. | 365/170 |
| 5,295,097 A | 3/1994 | Lienau | 365/170 |
| 5,329,480 A | 7/1994 | Wu et al. | 365/170 |
| 5,652,445 A | 7/1997 | Johnson | 257/295 |
| 6,016,269 A | 1/2000 | Peterson et al. | 365/171 |
| 6,266,267 B1 | 7/2001 | Lienau | 365/145 |
| 6,515,897 B1 | 2/2003 | Monsma et al. | 365/173 |
| 6,906,947 B2 * | 6/2005 | Bloomquist et al. | 365/158 |
| 7,020,015 B1 * | 3/2006 | Hong et al. | 365/171 |
| 7,064,367 B2 * | 6/2006 | Hatate et al. | 257/295 |

* cited by examiner

NON-VOLATILE MAGNETIC MEMORY DEVICE

CROSS-REFERENCE TO RELATED APPLICATIONS

The present application is a continuation application of pending U.S. patent application Ser. No. 10/039,296, now U.S. Pat. No. 7,110,312 which was filed on Oct. 19, 2001, which claims the benefit of U.S. provisional patent application 60/242,396 filed on Oct. 20, 2000, each of which is herein incorporated by reference in its entirety.

FIELD OF THE INVENTION

This invention relates to magnetic memory devices. More particularly, it relates to a non-volatile magnetic memory cell.

BACKGROUND OF THE INVENTION

Non-volatile magnetic memory cells have been known for sometime. Prior art devices have utilized a geometrically simple linear magnetic element to store a magnetic field. The magnetic field can typically have one of two orientations, which are arbitrarily assigned to represent "0" and "1" bit values. The prior art devices typically utilize a Hall effect sensor to detect the orientation of the magnetic field, thereby determining the data value stored in the cell.

The geometrically simple linear magnetic elements typically require a more sensitive sensor to determine the orientation of their stored magnetic fields. As a result, prior art devices are typically not suitable for integration in a standard device integration process due to the need for special highly sensitive materials used in their sensor elements. Such materials must be isolated from other integrated components with barrier layers, thus, complicating the fabrication process.

Accordingly, there is a need for an improved magnetic memory cell with an improved magnetic element that allows its stored magnetic field to be sensed efficiently. Preferably, the improved magnetic memory cells is also suitable for integration in a standard complementary metal oxide semiconductor (CMOS) process.

SUMMARY OF THE INVENTION

In one aspect, the present invention provides a memory cell with a magnetic element with multiple segments that are not co-linear. A write line passes over each segment. The write line is used to transmit write signals that magnetize each segment with a magnetic field. The segments are arranged such that their magnetic fields produce magnetic flux fields that pass through a sensing region of a sensor. The sensor may be a Hall sensor or any other type of sensor for detecting the orientation of magnetic fields. Components of each magnetic flux field that are normal to the plane of the sensing region pass through the sensor in the same direction. When these components, which may be referred to as normal components, pass through the sensing region in one direction, the cell has a first orientation. When the components pass through the sensing region in an opposite direction, the memory cells has a second orientation. The first and second orientations of the memory cell may be arbitrarily assigned to represent two data values, such as "0" or "1" bit values.

Since the normal components pass through the sensing region in the same direction at any particular time, the magnetic flux fields have a cumulative effect on the sensing region. This allows the orientation of the cell to be determined using a less sensitive sensor than would be required if only a single magnetic flux field pass through the sensor.

In one embodiment, the magnetic element has three segments oriented as three sides of a rectangle, with the sensing region aligned generally with the center of the incomplete rectangle. In other embodiments, the magnetic element may have two, four, five, six or more segments.

In other embodiments, the magnetic element may be a curved shape which stores a corresponding curved magnetic field in response to write signals on a correspondingly curved write line.

In another aspect, separate magnetic elements are arranged about a sensing region of a sensor. The separate magnetic elements are magnetized by a common write line with separate magnetic fields. The magnetic fields create magnetic flux fields which pass through the sensing region. The magnetic flux fields have normal components that pass through the sensing region in the same direction. The particular direction defines a first and a second orientation. The magnetic flux fields have a cumulative effect at the sensing region.

In another aspect, the present invention provides a memory cell comprising: a magnetic element having a first segment, a second segment and a third segment for storing first, second and third remnant magnetic fields, in response to a write signal, wherein each of the first, second and third remnant magnetic fields may have a first direction or a second direction, and wherein when said first, second and third remnant magnetic fields are in said first direction the memory cell is in a first orientation, and wherein when said first, second and third remnant magnetic fields are in said second direction the memory cell is in a second orientation; a write line for applying said write signal to said magnetic element; and a sensor for detecting the orientation of the memory cell.

In another aspect, the present invention provides a memory cell comprising: a non-linear magnetic element; and a write line for storing a remnant magnetic field in said magnetic element.

In yet another aspect, the present invention provides a memory cell comprising: at least two magnetic elements; a sensor having a sensing region; and a write line for storing a remnant magnetic field in each of said magnetic elements, wherein, when said memory cell is in a first orientation, the magnetic field in each of said magnetic elements has a first direction with respect to said sensing region and when said memory cell is in a second orientation, the magnetic field in each of said magnetic elements has a second direction with respect to said sensing region.

In still another aspect, the present invention provides a memory cell comprising: a magnetic element having a notched section; a write line adjacent to said magnetic element for storing a remnant magnetic field in said magnetic element, wherein said magnetic field may have a first orientation or a second orientation; and a sensor for detecting the orientation of said magnetic field.

These and other aspects of the present invention will be understood from the following detailed description of a number of exemplary embodiments of the present invention.

BRIEF DESCRIPTION OF THE DRAWINGS

A preferred embodiment of the present invention will not be described in detail with reference to the drawings, in which like reference numerals indicate like parts throughout the several Figures. In the drawings.

DETAILED DESCRIPTION OF EXEMPLARY EMBODIMENTS OF THE INVENTION

Figure 1:
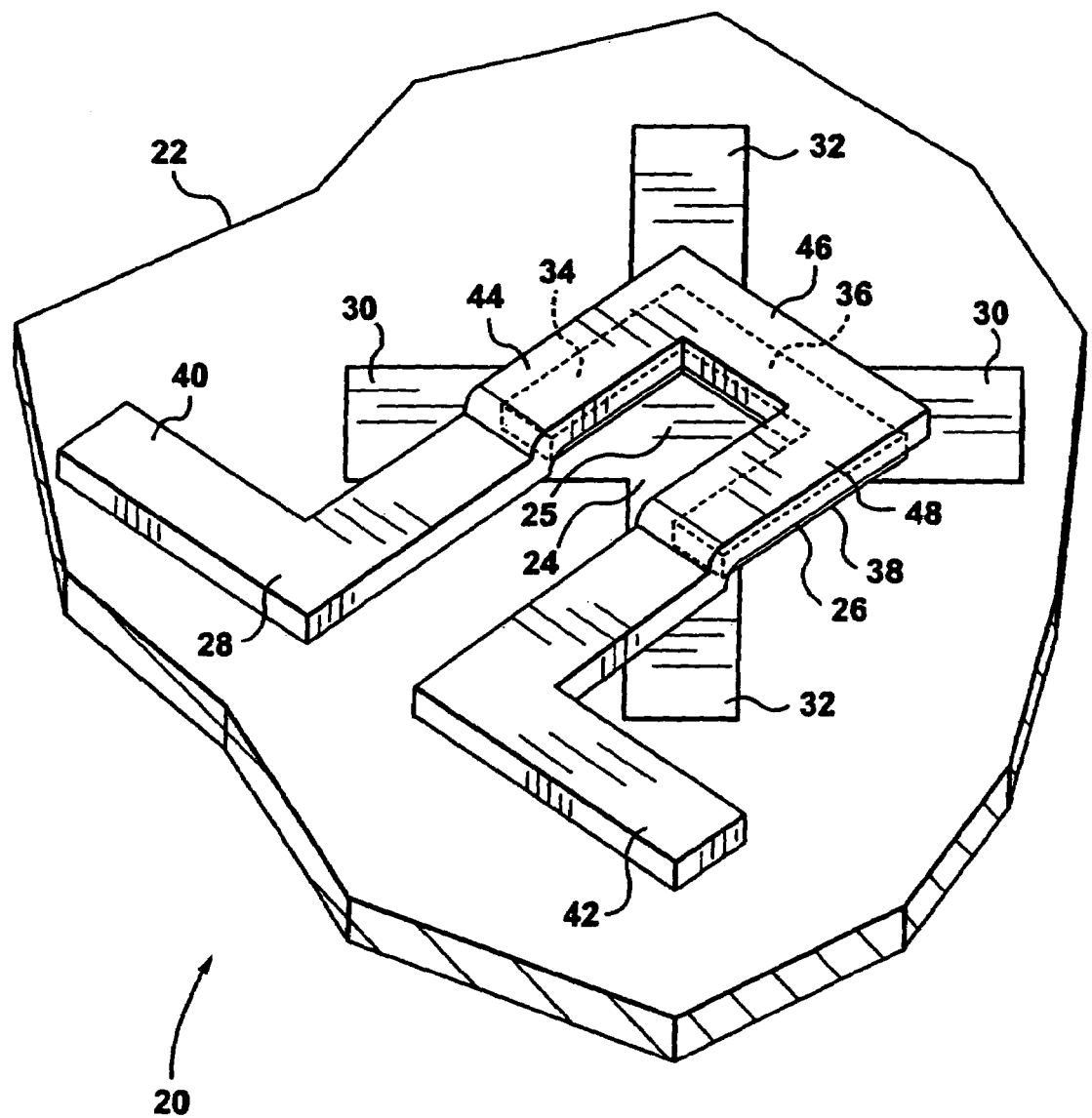
FIG. 1 is perspective view of a first embodiment of a memory cell according to the present invention.
Figure 2:
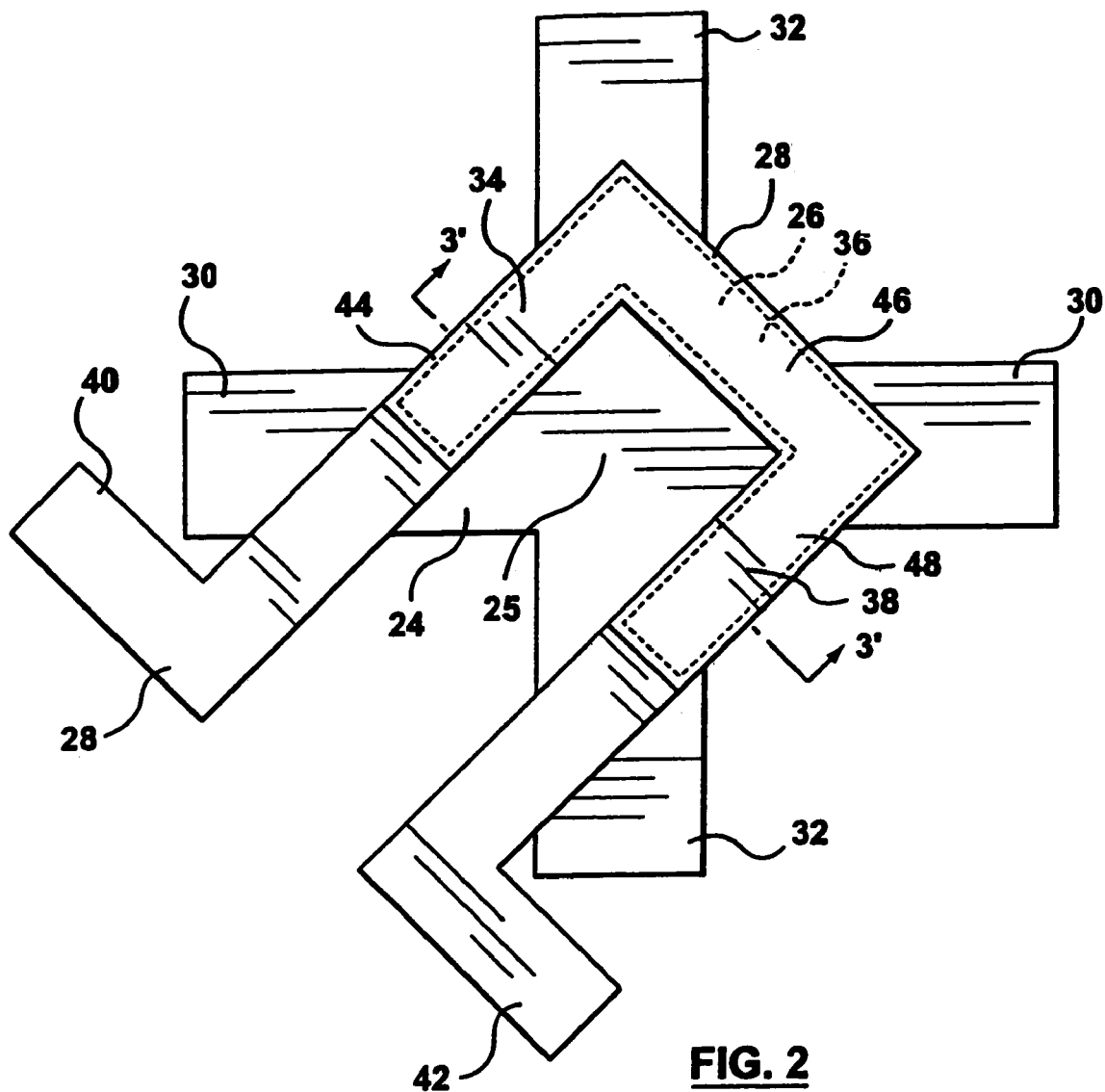
FIG. 2 is a top view of the memory cell of FIG. 1.
Figure 3:
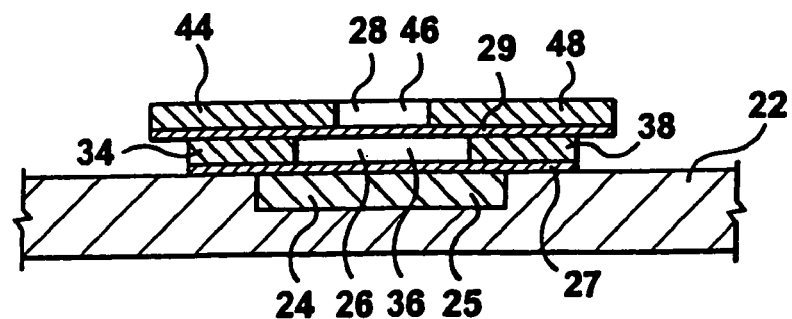
FIG. 3 is a cross-sectional view of the memory cell of FIG. 1, through section line 3'-3' on FIG. 2.

Reference is first made to FIGS. 1, 2 and 3, which illustrate a first exemplary magnetic memory cell 20 according to the present invention. Memory cell 20 is formed on a substrate 22. Memory cell 20 has a sensor 24, a magnetic element 26 and a write line 28.

Sensor 24 is formed in substrate 22 and has a current application line 30 and a voltage sensing line 32. Sensor 24 has a sensing region 25 at the intersection of a current application line 30 and voltage sensing line 32. In cell 20, substrate 22 is formed of silicon and sensor 24 is formed with a dual phosphorus implant in substrate 20. A low implant dose forms sensing region 25 in a p-type silicon substrate 22. A higher dose is implanted at the ends of current application line 30 and voltage sensing line 32 to form contact pads (not shown). Alternatively, the sensor could be formed using an epi grown n-type silicon isolated by a p-type implant. In alternative embodiments of the present invention, substrate 20 may be made of another material such as glass, ceramic or polymer materials. In such embodiment, sensor 20 would have to be deposited or otherwise formed on the substrate.

Magnetic element 26 is formed on top of sensor 24. Magnetic element 26 has three segments 34, 36 and 38. In memory cell 20, magnetic element 26 is formed from a nickel-iron alloy. Alternatively, magnetic element 26 could be made of another ferromagnetic material such as a cobalt-iron alloy or a cobalt-nickel alloy.

Write line 28 is formed on top of magnetic element 26. Write line 28 has a number of parts: first and second terminals 40 and 42 and intermediate segments 44, 46 and 48. Intermediate segments 44, 46 and 48 are formed on top of segments 34, 36 and 38 of magnetic element 26 and are preferably wider than segments 34, 36 and 38. The shape of write line 28 thus corresponds, in part, to the shape of magnetic element 26.

It is necessary to electrically isolate magnetic element 26 from sensor 24. A metal layer 27 (not shown in FIGS. 1 and 2) is formed between sensor 24 and magnetic element 26. Metal layer 27 is used as a bonding layer for attaching magnetic element 26 to substrate 22. In cell 20, metal layer 27 is formed of a titanium layer (formed first on substrate 22 adjacent to sensor 24) and a gold layer (formed on top of the titanium layer). At the interface between sensor 24 and the titanium layer of metal layer 27, a Schottky diode is formed that prevents the flow of electrical energy from sensor 24 to magnetic element 26, under zero or reverse bias conditions between magnetic element 26 and substrate 22. In an alternative embodiment of the present invention, the metal layer may be formed of only a titanium layer, or may be formed using a different metal.

To maintain the operation of the Schottky diode at this interface, the substrate may be negatively biased at all times with respect to the rest of cell 20, making the Schottky diode reverse biased. Alternatively, the isolation condition may be maintained across the interface by (i) opening all paths between write line 28 and round during a bit detection operation, which is explained below with reference to FIGS. 9 and 10; and (ii) opening all paths between sensor 24 and ground during a bit write operation, which is explained below with reference to FIGS. 5-8.

In addition, cell 20 has an insulating layer 29 (not shown in FIGS. 1 and 2) formed between magnetic element 26 and write line 28. In an alternative embodiment of the present invention, this insulating layer could be omitted, as long as all paths between sensor 24 and ground are opened during a bit write operation. Therefore, if the second paragraph mentioned above for maintaining the bias of the Schottky diode is adopted, then insulating layer 29 may be omitted.

In another embodiment of the present invention, an insulating layer could also be formed between sensor 24 and metal layer 27 to further isolate sensor 24 from magnetic element 26. Such an insulating layer is preferably omitted, for reasons discussed below, however, its use falls within the scope of the present invention. In another alternative embodiment of the present invention, an insulating layer may be used in the place of metal layer 27 to isolate magnetic element 26 from sensor 24.

Figure 4:
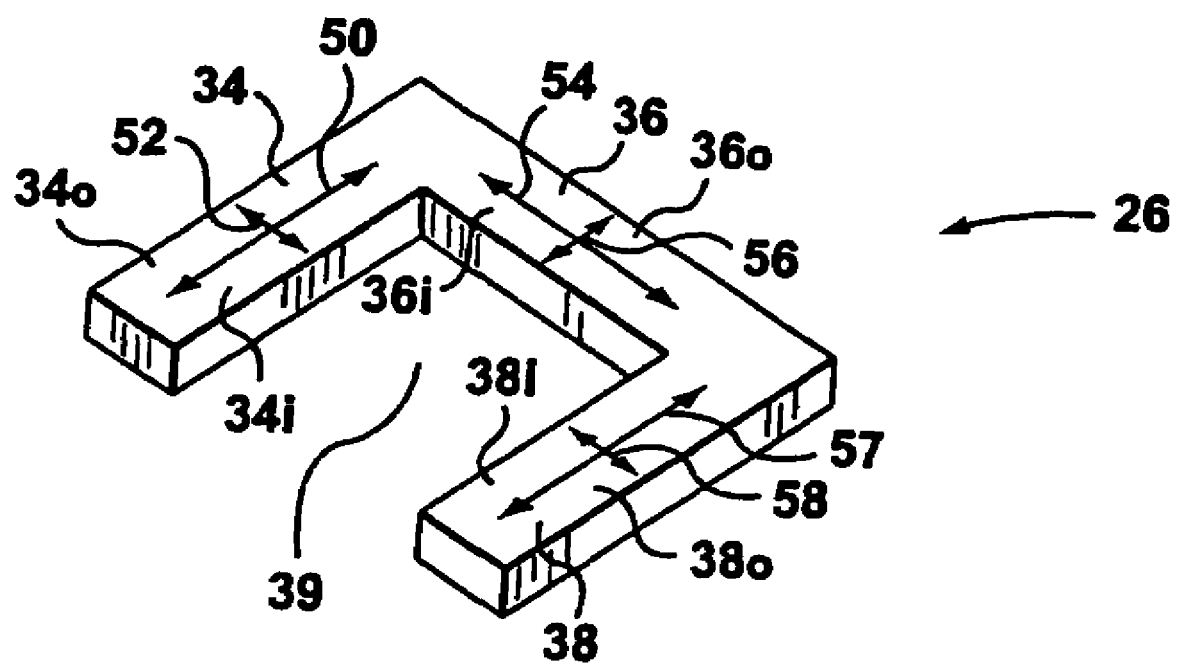
FIG. 4 is a perspective view of a magnetic element of the memory cell of FIG. 1.

Referring also to FIG. 4, segments 34, 36 and 38 together define a middle region 39. Each of segments 34, 36 and 38 has an inner side and an outer side. The inner sides 34$i$, 36$i$ and 38$i$ of the three segments are adjacent to region 39. The outer side 34o, 36o and 38o are on opposite sides of segments 34, 36 and 38. Middle region 39 is generally aligned with sensing region 25 of sensor 24.

The process of writing data to cell 20 will not be explained. Reference is briefly made to FIG. 1. Magnetic element 26 is magnetized by transmitting a write signal on write line 28. The write signal may be transmitted from terminal 40 to terminal 42, passing through segment 44, then segment 46 and then through segment 48. Alternatively, a write signal may be transmitted from terminal 42 to terminal 40, passing through segment 48, segment 46 and segment 44.

Figure 5:
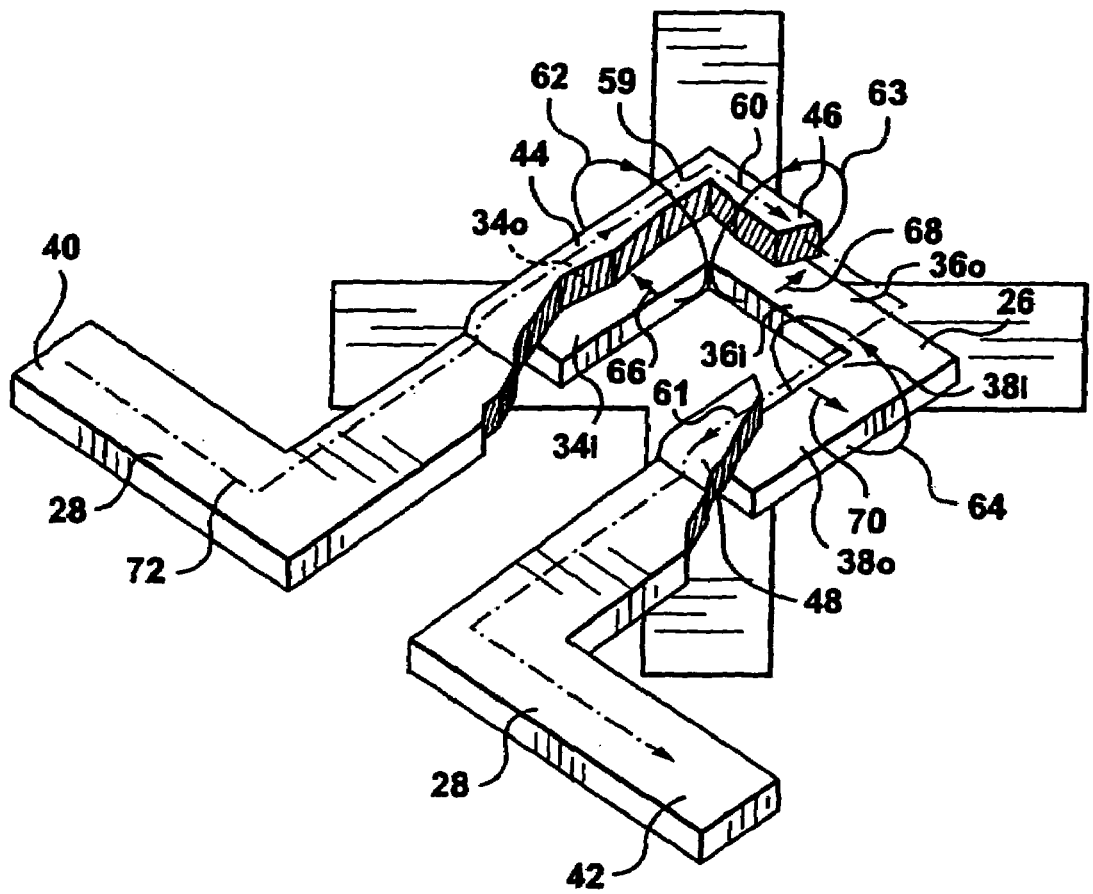
FIG. 5 is a cutaway perspective view of the memory cell of FIG. 1 being paced into a first orientation.
Figure 6:
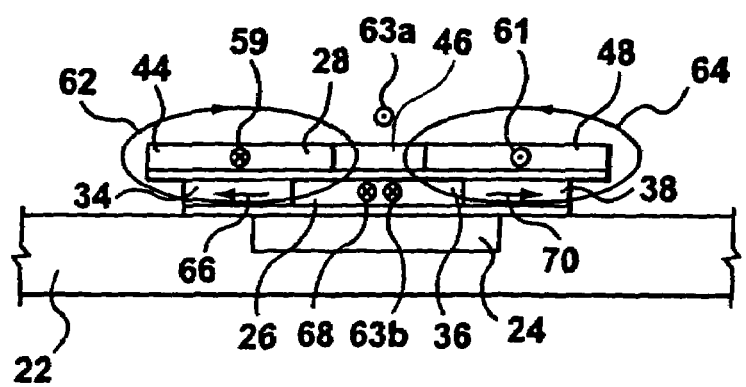
FIG. 6 is sectional view of the memory cell of FIG. 1 in the first orientation of FIG. 5, taken through section line 3'-3' of FIG. 2.

Reference is made of FIGS. 5 and 6, which illustrate the transmission of a write signal 72 from terminal 40 to terminal 42 through segments 44, 46 and 48 of write line 28. FIG. 6 is a sectional view of cell 20 taken along the same section line as FIG. 3. The shading of sectioned elements has been omitted for clarity in the drawing.

Write signal 72 travels in segment 44 in direction 59 (into the page in FIG. 6). The write signal 72 will travel in segment 46 in the direction of arrow 60. The write signal 72 will travel in segment 48 in the direction of arrow 61 (out of the page in FIG. 6). In accordance with the well known "right-hand rule", the write signal 72 will create a magnetic field 62 around segment 44. The write signal 72 will create a magnetic field 63 (illustrated at 63a and 63b in FIG. 6) around segment 45. The write signal 72 will create a magnetic field 64 around segment 48. (A person skilled in the art will recognize that magnetic field lines 62, 63 and 64 and direction indicators 63a and 63b are merely representative of the whole magnetic fields created by the write signal 72.)

Segment 34 of magnetic element 26 is responsive to magnetic field 62 and acquires a magnetic field 66. When the write signal 72 is removed, segment 34 remains magnetized with magnetic field 66 (which will have smaller magnitude than when the write signal 72 is being applied). That is, magnetic field 66 remains in segment 34 as a remnant magnetic field.

Similarly, segment 36 is responsive to magnetic field 63 and acquires a magnetic field 68, which is retained after write signal 72 is removed. Segment 38 is responsive to magnetic field 64 and acquires a magnetic field 70, which is retained after write signal 72 is removed. A skilled person will recognize that segments 34, 36 and 38 remain magnetized with remnant magnetic fields 66, 68 and 70 due to the well known property of hysteresis exhibited by ferromagnetic materials due to anisotropy.

In cell 20, write line 28 is wider than segments 34, 36 and 38 in the directions identified by arrows 52, 56 and 58. This relationship is desirable so that that magnetic field 62, for example, around segment 44 passes through segment 34 substantially in the direction 62 in which segment 34 is to be magnetized. In other embodiments, each segment of write line 28 is at least as wide as an associated segment of magnetic element 26.

Magnetic fields 66, 68 and 70 share a common orientation with respect to elements 34, 36 and 38 and middle region 39. Magnetic field 66 has its south pole at the inner side 34i of element 34 and its north pole at the outer side 34o of element 34. Similarly, magnetic field 68 has its south pole at the inner side 36i of element 36 and its north pole at the outer side 36o of element 36. The south pole of magnetic field 70 is at the inner side 38i of element 38 and its north pole is at the outer side 38o of element 38.

Figure 7:
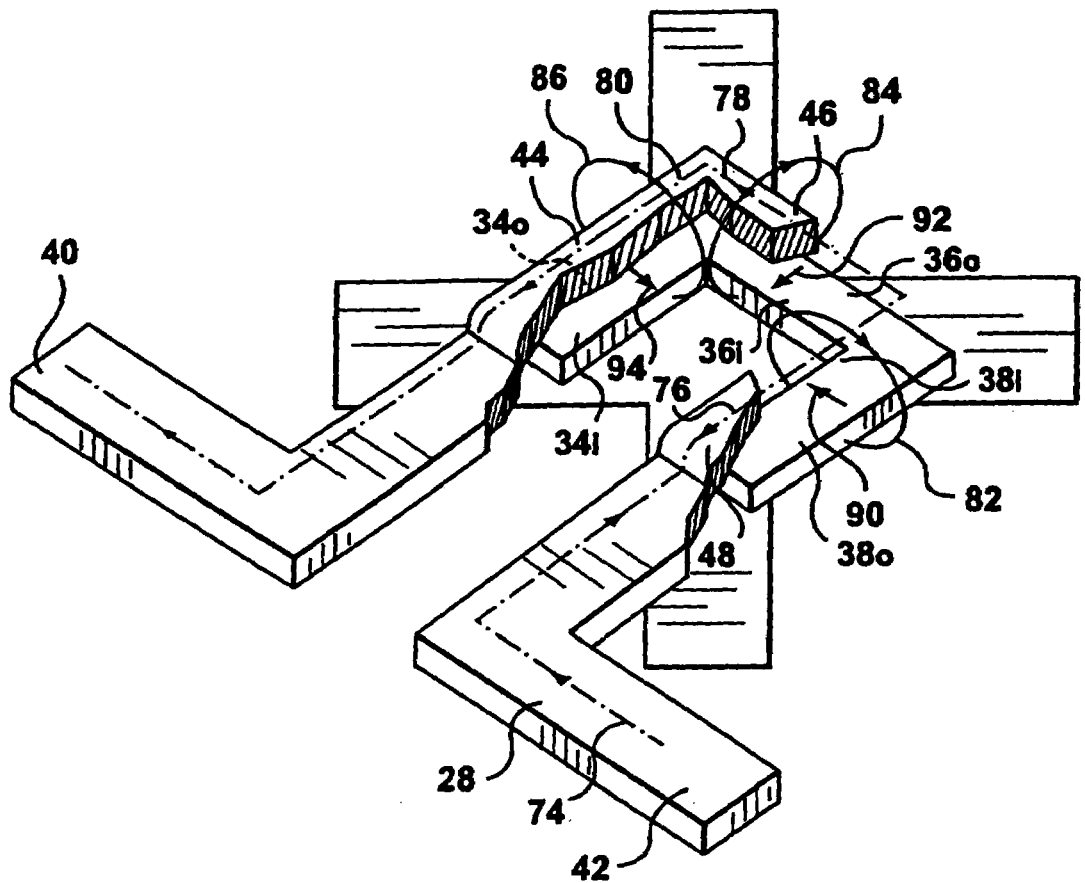
FIG. 7 is a cutaway perspective view of the memory cell of FIG. 1 being placed into a second orientation.
Figure 8:
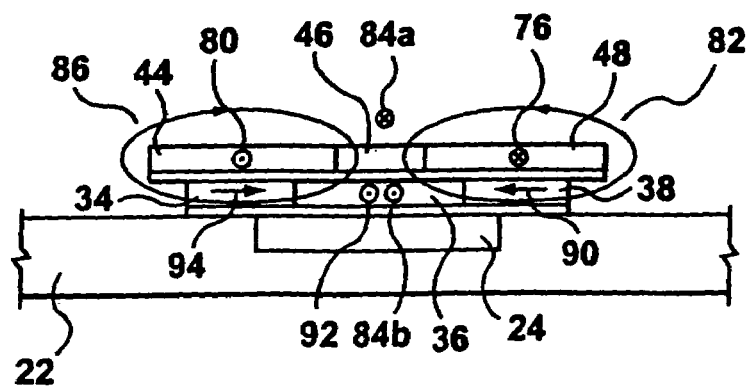
FIG. 8 is sectional view of the memory cell of FIG. 1 in the second orientation of FIG. 7, taken through section line 3'-3' of FIG. 2.

Reference is next made to FIGS. 7 and 8 which illustrates the operation of cell 20 in response to a write signal 74 transmitted from terminal 42 to terminal 40. FIG. 8 is a sectional view of cell 20 taken along the same section lines FIG. 3. The shading of sectioned elements has been omitted for clarity in the drawing.

Write signal 74 travels through elements 48, 46 and 44 as indicated by arrows 76, 78 and 80. Write signal 74 creates magnetic fields 82, 84 and 86 respectively around elements 48, 46 and 44 write line 28. Magnetic fields 82, 84 and 86 produce magnetic fields 90, 92 and 94 in elements 38, 36 and 34, which remain as remnant magnetic fields after write signal 74 is removed. Magnetic fields 90, 92 and 94 have their south poles at the outer sides 38o, 36o and 34o of their respective elements 38, 36 and 34. Magnetic fields 90, 92 and 94 have their north poles at the inner sides 38i, 36i and 34i of their respective elements 38, 36, 34.

Write signal 72 may be used in this way to magnetize magnetic element 26 with magnetic fields 66, 68 and 70 oriented toward middle region 39 (FIG. 2). Correspondingly, write signal 74 may be used to magnetize magnetic element 26 with magnetic fields 90, 92 and 94 oriented away from middle region 39. The magnetic fields stored in magnetic element 26 are non-volatile and will remain stored until they are changed, typically by the application of a write signal that creates opposite magnetic fields.

When magnetic element 26 stores magnetic fields 66, 68 and 70, cell 20 has a first orientation. When magnetic element 26 stores magnetic field 90, 92 and 94, cell 20 has a second orientation. The two orientations may be arbitrarily assigned digital values of "0" or "1". Cell 20 is thus capable of storing one bit of digital information. As an example, cell 20 may be deemed to store a "0" bit when it is in its first orientation and may be deemed to store a "1" bit when it is in its second orientation. Alternatively, the assignment of "0" and "1" bit values may be reversed.

Typically, write signal 72 and write signal 74 will be applied to write line 28 under the control of a microprocessor, micro-controller or another control device to store "0" and "1" bit values in cell 20.

Figure 9:
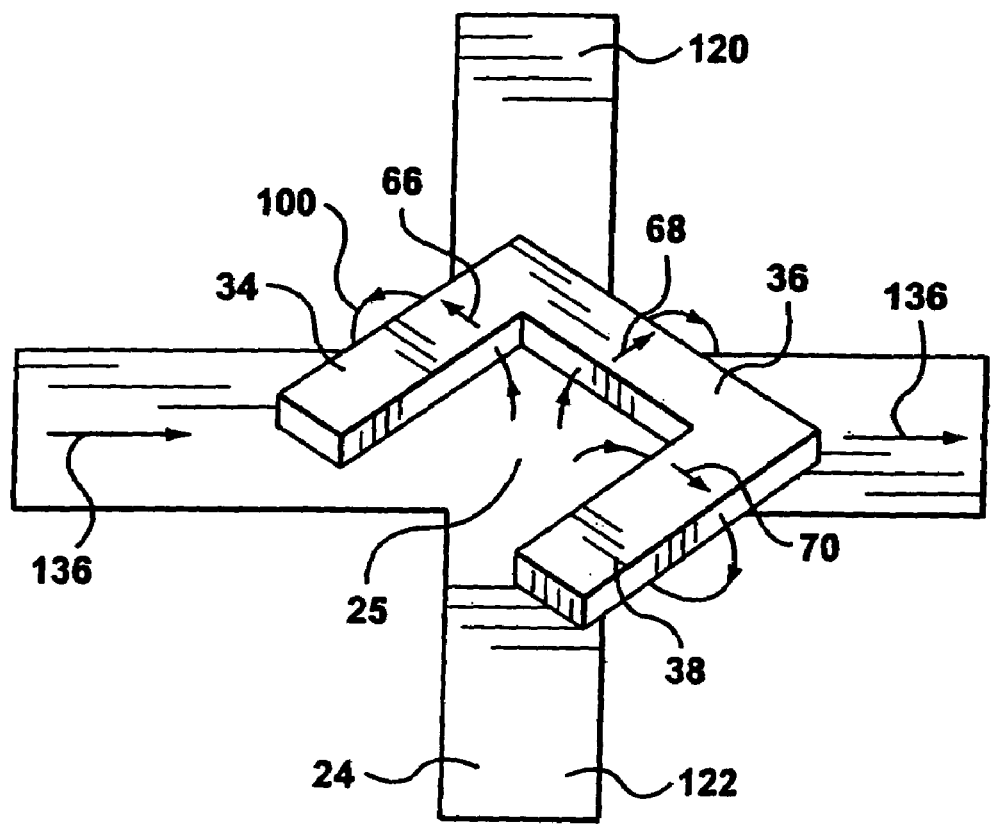
FIG. 9 is perspective view of a magnetic element and a sensor of the memory cell of FIG. 1 in the first orientation of FIG. 5.
Figure 10:
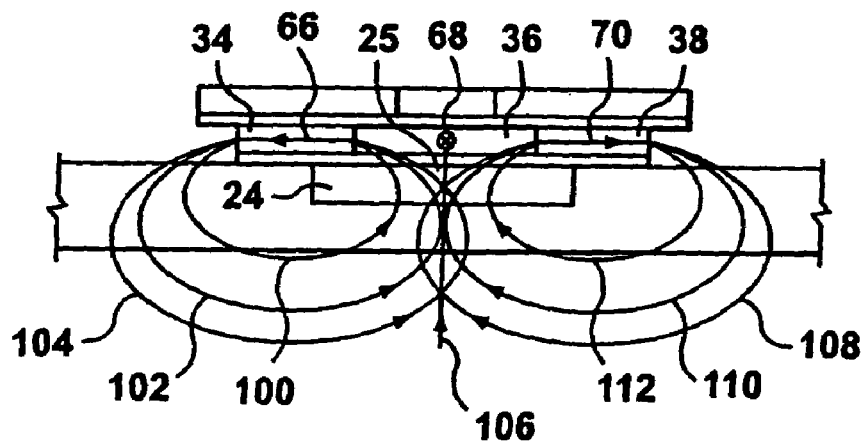
FIG. 10 is a sectional view of the magnetic element and sensor of the memory cell of FIG. 1 in the first orientation, taken through section line 3'-3' of FIG. 2.

The use of sensor 24 to detect the orientation of cell 20 will now be described. Reference is made to FIGS. 9 and 10. FIG. 9 illustrates the magnetic element 26 and sensor 24 of cell 20. FIG. 10 is a sectional view of cell 20 taken along the same section line as FIG. 3. The shading of sectioned elements has been omitted for clarity in the drawing.

In FIGS. 9 and 10, cell 20 is in its first orientation: segments 34, 36 and 38 of magnetic element 26 store magnetic fields 66, 68 and 70. Write line 28 is not illustrated in FIG. 9, and no write signal is being applied to cell 20.

The magnetic field 66 stored in segment 34 creates a magnetic flux field around segment 34. The magnetic flux field is illustrated by flux lines 100, 102, 104, which are only representative of the entire magnetic flux field. (In FIG. 9, only flux line 100 is shown for clarity of the Figure). A skilled person will recognize that the magnetic flux field created by magnetic field 66 also extends above segment 34. This part of the magnetic flux field is not relevant to the present invention and is accordingly not illustrated. Flux lines 100, 102, 104 have a direction, which is determined by the orientation of magnetic field 66. Flux lines 100, 102, 104 have a counterclockwise direction, in the view of FIG. 10, as illustrated by arrow heads on these flux lines.

Similarly, the magnetic field 68 stored in segment 36 creates a magnetic flux field around segment 36. This magnetic flux field is illustrated by flux line 106. Flux lines 106 has a direction that is determined by the orientation of magnetic field 68 and which is illustrated by the arrow head on flux line 106.

The magnetic field 70 stored in segment 38 creates a magnetic flux field around segment 38. This magnetic flux field is illustrated by flux lines 108, 110 and 112 (only flux line 108 is shown in FIG. 9). Magnetic flux lines 108, 110, 112 have a direction determined by the orientation of magnetic field 70 and which is illustrated by the arrow heads on flux lines 108, 110, 112.

Each of magnetic flux lines 100-112 pass through the sensing region 25 of sensor 24 in the same direction (i.e., from its bottom to its top, as illustrated in FIG. 9. More precisely, the vertical component of each of magnetic flux line 100-112 is parallel, although they may have different horizontal components. Each of these vertical components is normal to the plane of sensor 24.

In cell 20, sensor 24 is a Hall effect sensor. The operation of a Hall effect sensor is well known and may be described here briefly. A sensor current 136 is applied across current application line 30. The flow of sensor current 136 through sensing region 25 is affected by the magnetic flux fields created by magnetic fields 66, 68 and 70, effectively changing the direction of free carriers flowing as part of sensor current 136. These flux fields have a cumulative effect on the sensor current 136, since they pass through the sensing region in the same vertical direction. The change in the direction of the free carriers in sensing region 25 creates a charge separation that can be sensed at terminals 120, 122 as potential gradient, commonly referred to as the Hall voltage. The magnitude of the Hall voltage will correspond to the total vertical components of the magnetic flux lines passing through sensing region 25.

If the orientation of cell 20 is reversed so that segments 34, 36 and 38 store magnetic field 94, 92 and 90, then the flux fields around segments 34, 36 and 38 will have the opposite direction—the directions of flux lines 100-112 will be reversed. The vertical components of flux lines 100-112 will pass through sensing region 25 from top to bottom and the Hall voltage measured across terminals 120, 122 will have an opposite polarity.

In this way, the orientation of cell 20 may be determined by measuring the polarity of the Hall voltage across terminals 120, 122. The use of a Hall sensor allows the orientation of cell 20 to be determined in a non-destructive way—i.e. the orientation of cell 20 is not destroyed or changed by the sensing process.

Segments 34, 36 and 38 are positioned on three sides of sensing region 25. The multi-segment configuration of magnetic element 26 allows the magnetic flux fields created by the magnetic fields stored in all three segments 34, 36 and 38 to simultaneously affect the flow of free carriers in sensor current 136. The effect of the three magnetic fields is cumulative, thereby creating a larger overall vertical component for the flux field passing through sensing region 25 than would be created by a magnetic element with only single linear element.

The larger vertical component of the flux field may be measured more easily using a less sensitive Hall sensor than is required for prior art devices. As stated above, the Hall sensor 24 of cell 20 is formed of silicon. More sensitive Hall sensor materials as known. However, the use of a multiple segment magnetic element and the resulting cumulative magnetic flux fields allow the less sensitive silicon sensor to be used. This has the advantage that the Hall sensor may easily be integrated in the CMOS product. In contrast, more sensitive Hall sensor materials such as gallium arsenide and indium antinimide are not as readily integrated into a standard CMOS process.

Typically, the application of sensor current 136 through current application line 30 and the sensing of the Hall voltage at terminals 120, 122 will be performed by a microprocessor or a micro-controller or other control device (which will typically be the same device that controls the storage of data in the memory cell). In order to apply sensor current 136 and measure the Hall voltage, it is necessary to couple electrical circuitry to current application line 30 and voltage sensing line 32. Ot facilitate this, sensor 24 has been illustrated in the Figures at a 45° angle from the sides of magnetic element 26. The present invention is not limited to this angle, and in fact the angle is not required at all—sensor 24 may be oriented in the same horizontal and vertical directions as magnetic element 26 and write line 28, as long as its current application line 30 and voltage sensing line 32 are accessible.

As note above, in cell 20, sensor 24 and magnetic element 26 are not separated by an insulating layer but are instead electrically insulated by a Schottky diode formed between metal layer 27 and sensor 24. The absence of an insulating layer allows the magnetic element to be positioned closer to sensor 24. This results in a stronger magnetic flux field (from each of the magnetic fields stored in segments 34, 36 and 38) passing through sensing region 25. This also allows a less sensitive Hall sensor to be used.

The present invention is not limited to the use of a Hall sensor. In another embodiment of the present invention, a different type of sensor may be used. Alternative sensor that are known in the art include induction sensor, flux gate sensor, magnetoresistance sensors magneto-optical sensors, magFET sensors, magMOSFET sensors and phase change sensors.

FIGS. 11 to 20 illustrate additional embodiments of the present invention. In each case, the illustrated embodiment is formed on a substrate that is not shown in these Figures.

Figure 11:
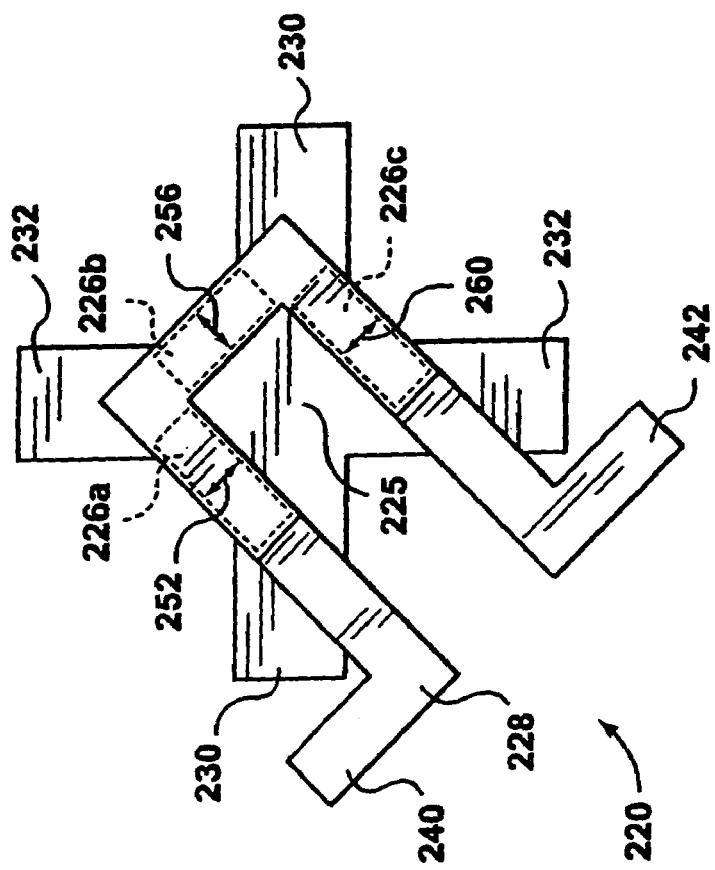
FIG. 11 is a top view of a second embodiment of a memory cell according the present invention.

FIG. 11 illustrates a second embodiment of a memory cell 220 according to the present invention. Memory cell 220 has a substrate (not shown), a sensor 224 formed in substrate, three separate magnetic elements 226a, 226b and 226c and a write line 228. Magnetic elements 226a, 226b and 226c are generally rectangular. One segment 244, 246 or 248 of write line 228 is aligned with each of the magnetic elements. The three magnetic elements 226a, 226b and 226c are responsive to write signals transmitted between terminals 240 and 242 of write line 228 to store remnant magnetic fields in their hard directions of magnetization 252, 256 and 260. Like segments 34, 36 and 38 of magnetic element 26 (FIG. 1), the magnetic fields may have their south poles towards the sensing region 225 of sensor 224 in a first orientation or may have their north poles towards sensing region 225 in a second orientation. The orientation of cell 220 may be sensed using sensor 224 in the same way as sensor 24 of cell 20 (FIG. 1).

Figure 12:
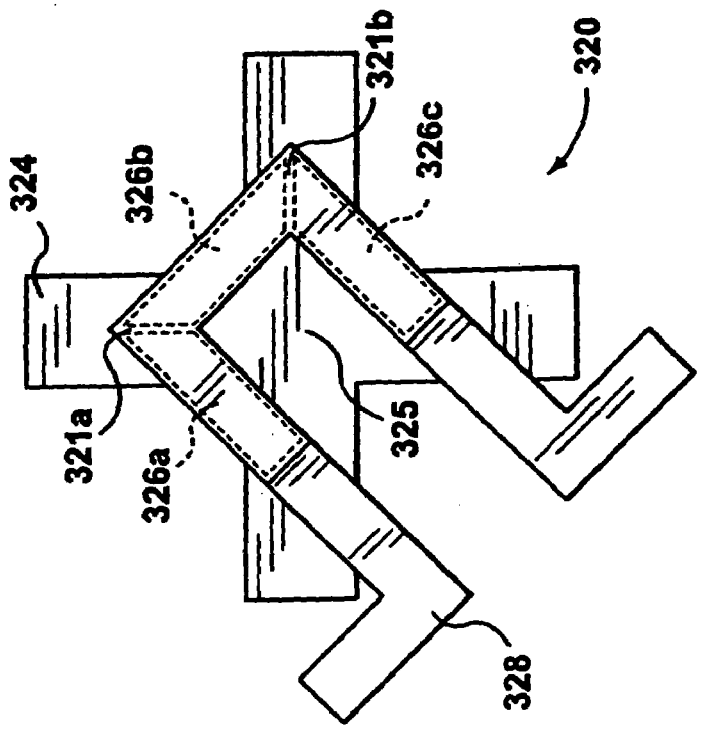
FIG. 12 is a top view of a third embodiment of a memory cell according to the present invention.

FIG. 12 illustrates a third embodiment of a memory cell 320 according to the present invention. Memory cell 320 is similar to memory cell 220 (FIG. 11), except that magnetic elements 326a, 326b and 326c are not rectangular. Instead, 326, 326b and 326c approximate the shape of magnetic element 26, with a gap at corner regions 321a and 321b. Write line 328 and sensor 324 are used in the same way as write line 28 and sensor 24 to write data to cell 320 and to sense the data stored in cell 320.

Figure 13:
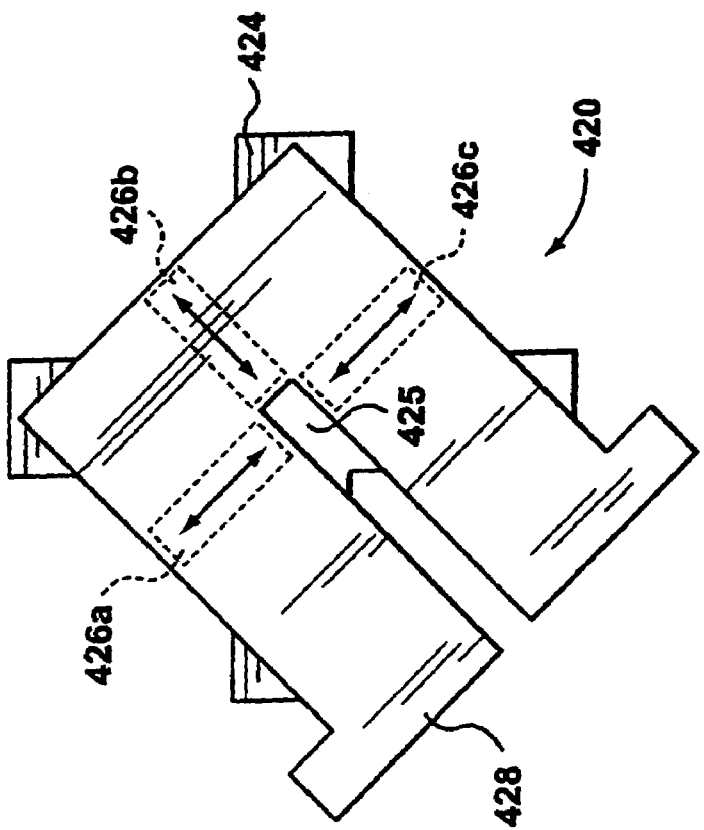
FIG. 13 is a top view of a fourth embodiment of a memory cell according to the present invention.

FIG. 13 illustrates a fourth embodiment of a memory cell 420 according to the present invention. Memory cell 420 has three separate rectangular magnetic elements 426a, 426b and 426c, which are arranged with their shorter dimension towards sensing region 425.

Figure 14:
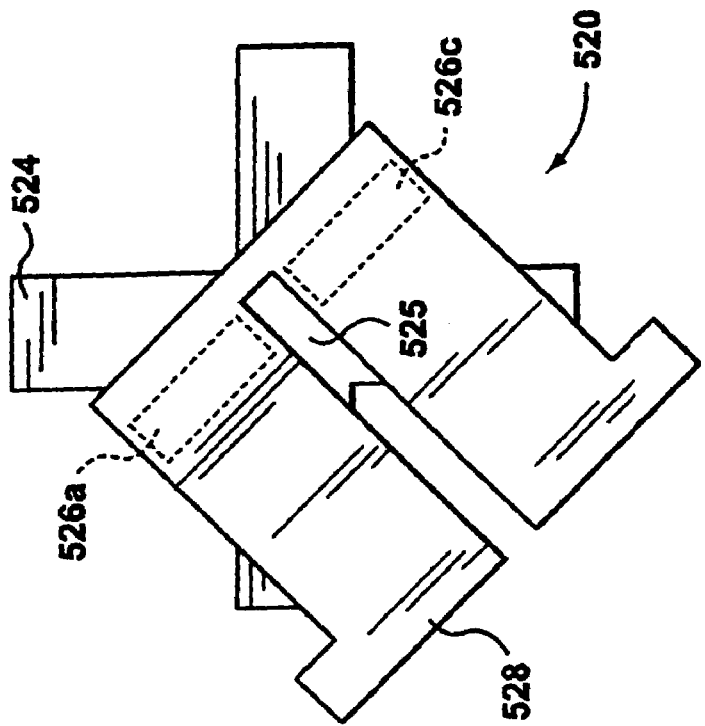
FIG. 14 is a top view of a fifth embodiment of a memory cell according to the present invention.

FIG. 14 illustrates a fifth embodiment of a memory cell 520 according the present invention. Memory cell 520 differs from memory cell 420 in that magnetic element 426b has been removed. Otherwise, memory cell 520 operates in the same manner as memory cell 420.

Figure 15:
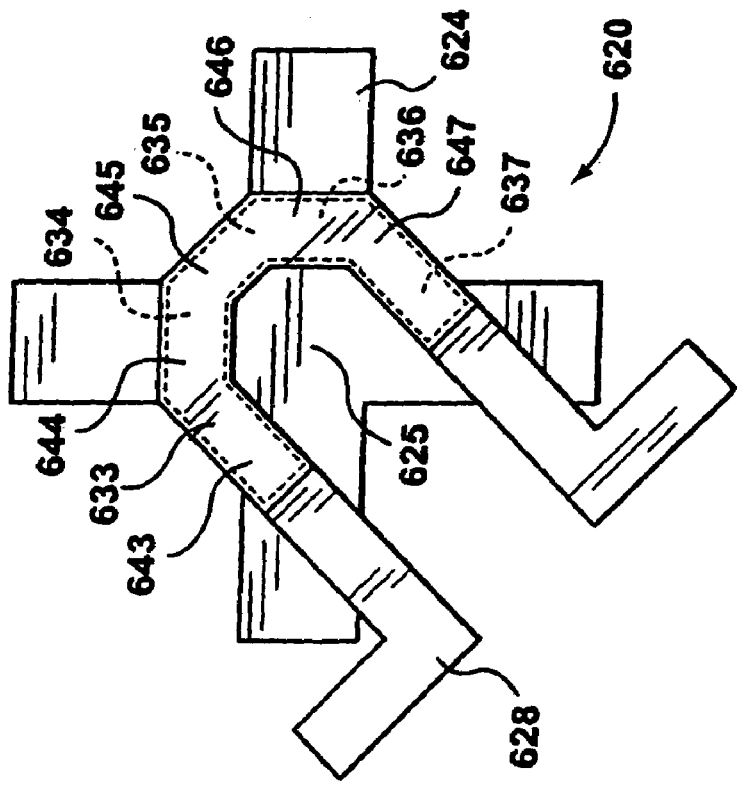
FIG. 15 is a top view of a sixth embodiment of a memory cell according to the present invention.

FIG. 15 illustrates a sixth embodiment of a memory cell 620 according to the present invention. Like memory cell 20, memory cell 620 has as integral magnetic element 626. However, magnetic element 626 has five segments 633, 634, 635, 636 and 637. Similarly, write line 628 has a segment 643, 644, 645, 646, 647 that corresponds to each of the segments 633-637 of magnetic element 626. Each segment 633-637 becomes magnetized in response to a write signal on write line 628. The magnetic fields stored in each of the segments 633-637 produce cumulative vertical magnetic flux components through sensing region 625 of sensor 624, which can be sensed as described above in relation to sensor 24.

Figure 16:
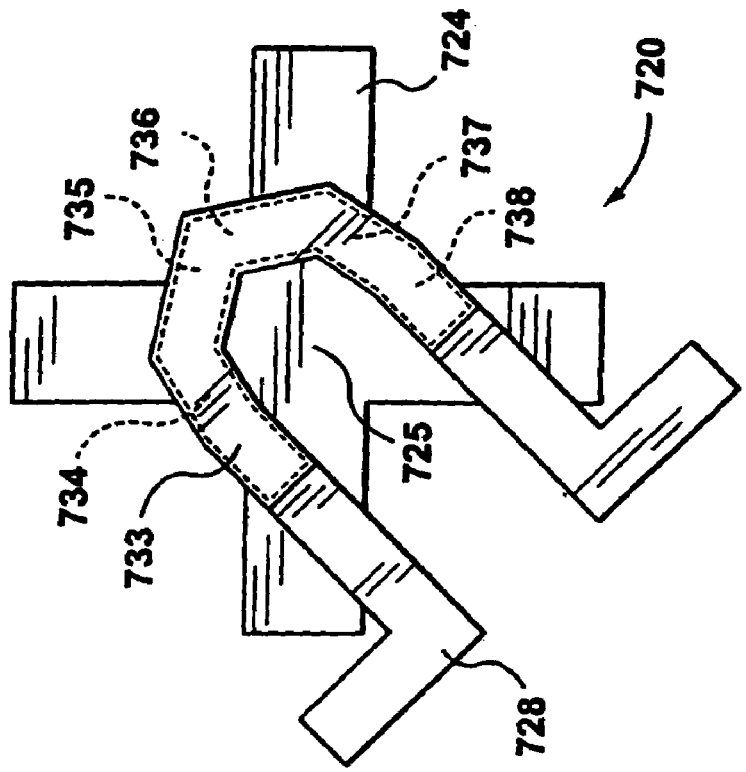
FIG. 16 is a top view of a seventh embodiment of a memory cell according to the present invention.

FIG. 16 illustrates a seventh embodiment of a memory cell 720 according to the present invention. Memory cell 720 differs from memory cell 620 only by the addition of a sixth segment 738 to magnetic element 726. Otherwise, memory cell 720 operates in the same way as memory cell 620.

Figure 17:
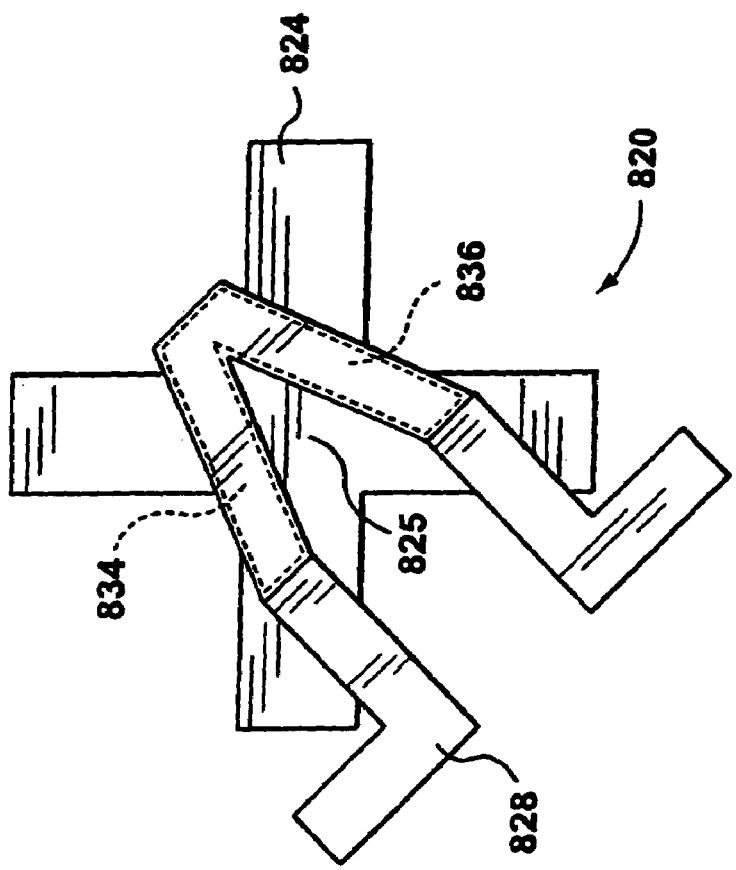
FIG. 17 is a top view of a eighth embodiment of a memory cell according to the present invention.

FIG. 17 illustrates an eighth embodiment of a memory cell 820 according to the present invention. Memory cell 820 has a magnetic element 826 with only two segments 834 and 836. Memory cell 820 operates in the same manner as memory cells 20, 620 and 720.

Memory cells 20, 620, 720 and 820 illustrate that a memory cell according to the present invention my be formed having 2 or more segments as part of a integrated geometrically non-linear magnetic element. Furthermore, memory cell 220, 320, 420, and 520 illustrate that a memory cell according to the present invention may incorporate two or more independent magnetic elements. In each of these embodiments, each segment of the magnetic element or each independent magnetic element stores a magnetic field which in turn creates a magnetic flux field through a sensing region of a sensor. Each magnetic flux field has a component that is normal to the place of the sensing region and each of these components is in the same direction. The magnetic flux field thus act cumulatively through the sensing region, allowing the orientation of the memory cell to be sensed.

Figure 18:
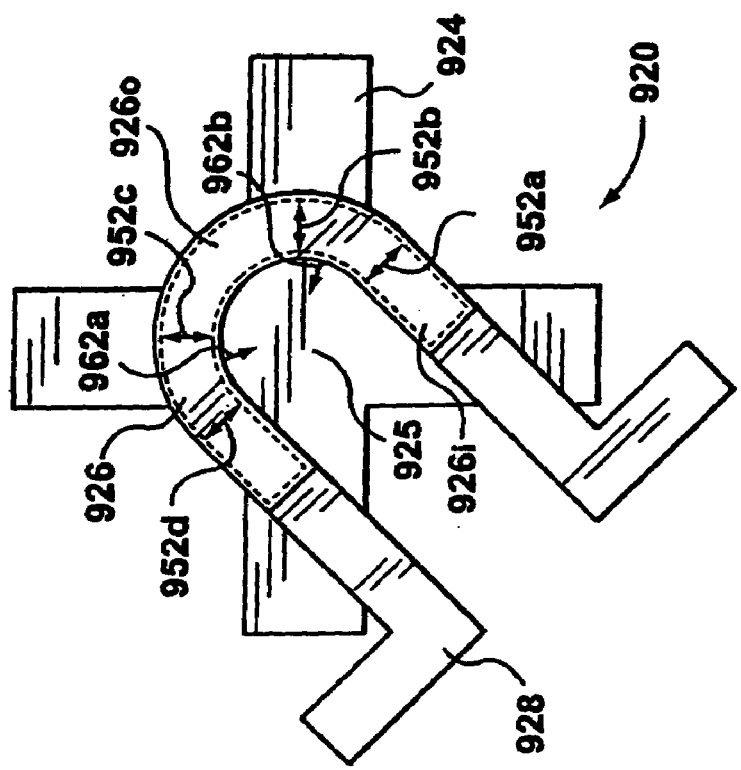
FIG. 18 is a top view of a ninth embodiment of a memory cell according to the present invention.

FIG. 18 illustrates a ninth embodiment of a memory cell 920 according to the present invention. Memory cell 920 has a semi-circular magnetic element 926. Write line 928 also has a semi-circular shape where it overlies magnetic element 926. Magnetic element 926 is responsive to a write signal transmitted on write line 928 to store a remnant magnetic field. The magnetic field has a shape corresponding to that of magnetic element 926. The poles of magnetic field are aligned along the inner edge 926i and outer edge 926o of magnetic element 926. Accordingly, the magnetic field in any part of magnetic element 926 will be aligned radially, as illustrated by lines 952a, 952b, 952c and 952d. The magnetic field at any part of magnetic element 926 will produce magnetic flux fields through sensing region 925 as generally indicated by arrows 962a and 962b. These magnetic flux fields will have cumulative components normal to the plane of sensing region 925 and these components may be measured using sensor 924 in the same manner as described above in relation to sensor 24.

Figure 19:
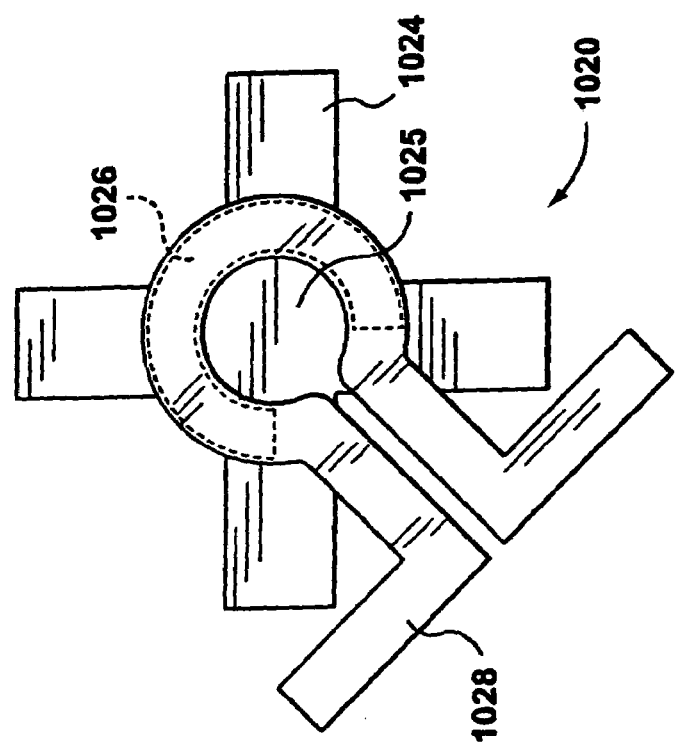
FIG. 19 is a top view of a tenth embodiment of a memory cell according to the present invention.

FIG. 19 illustrates a tenth embodiment of a memory cell 1020 made according to the present invention. Memory cell 1020 has a magnetic element 1026 in the shape of an open or incomplete toroid. Magnetic element 1026 is operated in a similar manner as magnetic element 926 to store a curved remnant magnetic field, which in turn can be measured using sensor 1024 in the manner described above for sensor 24. Write line 1028 has a similar open toroid shape where it overlies magnetic element 1026. Magnetic element 1026 surrounds sensing region 1025 almost completely and accordingly will provide a substantial magnetic flux field through sensing region 1025. However, the extremely curved shape of write line 1028 may result in substantial inductance in write line 1028, slowing down the transmission of write signals on write line 1028 and possibly slowing the rate at which the orientation of a magnetic field stored in magnetic element 1026 may be reversed.

FIGS. 18 and 19 illustrate that a memory cell according to the present invention may have a magnetic element with a curved shape that includes a part of a circle or other curved shape (such as an ellipse).

Figure 20:
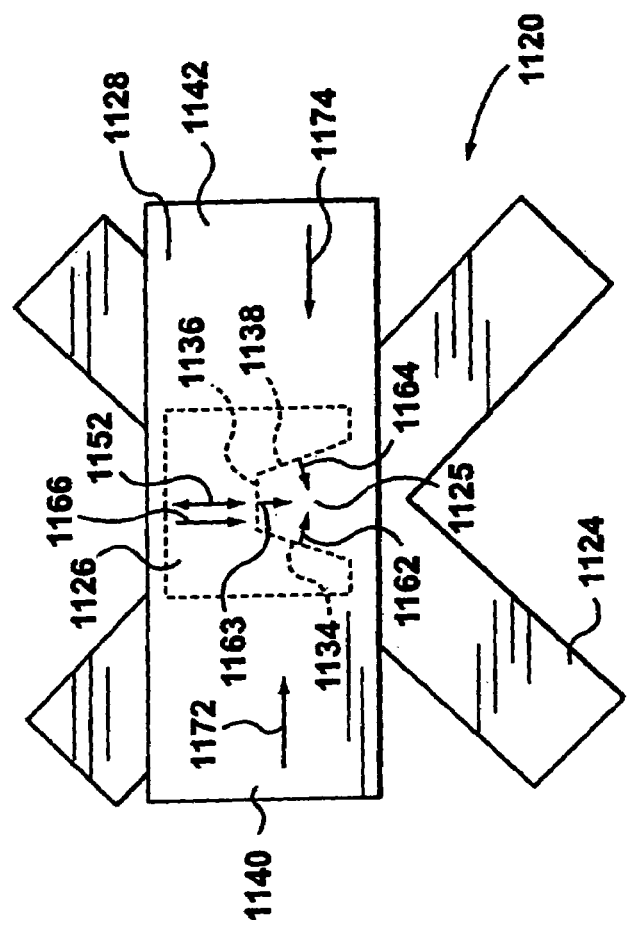
FIG. 20 is a top view of a eleventh embodiment of a memory cell according to the present invention.

Reference is next made to FIG. 20, which illustrates an eleventh embodiment of a memory cell 1120 according to the prevent invention. Memory cell 1120 has a substrate 1122 (not shown), a sensor 1124, a magnetic element 1126 and a write line 1128. Sensor 1124 has a sensing region 1125, a current application line 1130 and voltage sensing line 1132.

Magnetic element 1126 is generally rectangular, with a trapezoidal section defined by sides 1134, 1136 and 1138 removed. Sides 1134, 1136 and 1138 are adjacent to the generally surround sensing region 1125. Write line 1128 is linear and has terminals 1140 and 1142. A write signal 1172 may be transmitted on write line 1128 from terminal 1140 to terminal 1142. Alternatively, a write signal 1174 may be transmitted from terminal 1142 to terminal 1140. Magnetic element 1126 will be magnetized by a write signal in either direction and will store a remnant magnetic field in the direction of line 1152. The particular orientation of the remnant magnetic field will depend on the direction of the write signal.

A known property of ferromagnetic materials is that magnetic flux field lines typically exit the surface of such materials at an angle to the plane of the surface. Typically, the angle will be 45° or greater. The precise angle at which the magnetic flux lines will exit the surface will depend on the permeability gradient between magnetic material and the surrounding materials. If magnetic element 1126 has a remnant magnetic field as indicated by arrow 1166, then, as a result of this property, magnetic flux field lines will exit sides 1134, 1136 and 1138 of magnetic element generally in the direction of arrows 1162, 163 and 1164. These magnetic flux field lines will pass through sensing region 1125. As in the case of the preceding embodiment, the magnetic flux field lines will have a cumulative component that is normal to the plane of sensing region 1125, allowing the orientation of the magnetic field 1166 to be sensed. If magnetic element 1126 has the opposite magnetic field stored in it due to a write signal 1174, magnetic flux lines will flow opposite to arrows 1162, 1163 and 1164 and this may be sensed using sensor 1125.

Memory cell 1120 has the advantage of a linear write line 1128, which will have almost no inductive component added to it as a result of the structure of memory cell 1120. This will reduce the slewing time of a write signal 1172 or 1174 through write line 1128. Memory cell 1120 still provides a set of magnetic flux lines flowing in different directions from magnetic element 1126, which have a common cumulative component through sensing region 1125.

A number of specific embodiments of the present invention have been described. The embodiment may be modified in various ways by combining their several features and in additional ways that will be apparent to skilled persons. All such variants fall within the spirit and scope of the invention, which is limited only by the following claims.

We claim:

1. A memory cell comprising:
   (a) a magnetic element having a first segment, a second segment and a third segment for storing first, second and third remnant magnetic fields in response to a write signal, wherein each of the first, second and third remnant magnetic fields has a first direction or a second direction, and wherein when said first, second and third remnant magnetic fields are in said first direction the memory cell is in a first orientation, and wherein when said first, second and third remnant magnetic fields are in said second direction the memory cell is in a second orientation;
   (b) a write line for applying said write signal to said magnetic element, a portion of the write line having a shape that corresponds to the first, second, and third segments of the magnetic element to completely cover the magnetic element; and
   (c) a sensor for detecting the orientation of the memory cell.

2. The memory cell of claim 1 wherein each of said first segment, second segment and third segment has an inner side and an outer side and wherein said remnant magnetic field exists in each of said first, second and third segments between said inner and outer sides.

3. The memory cell of claim 2 wherein:
   (i) wherein the memory cell is in said first orientation, the inner side of each of said first, second and third segments has a north magnetization and the outer side of each of said first, second and third segments has a south magnetization; and
   (ii) when a memory cell is in said second orientation, the inner side of each of said first, second and third segments has a south magnetization and the outer side of each of said first, second and third segments has a north magnetization.

4. The memory cell of claim 1 wherein:
   (i) said first magnetic field has a first magnetic flux field, said second magnetic field has a second magnetic flux field and said third magnetic field has a third magnetic flux field; and
   (ii) said first, second and third magnetic flux fields pass through a sensing region of the sensor.

5. The memory cell of claim 4 wherein the magnetic element and the sensing region are substantially parallel.

6. The memory cell of claim 5 wherein said first, second and third magnetic flux fields have components that are substantially normal to the sensing region.

7. The memory cell of claim 6 wherein said components are cumulative in at least part of said sensing region.

8. The memory cell of claim 6 wherein said components are substantially the same.

9. The memory cell of claim 1 wherein:
   (i) said first segment produces a first magnetic flux field, said second segment produces a second magnetic flux field and said third segment produces a third magnetic flux field;
   (ii) said first, second and third magnetic flux fields pass through a sensing region of the sensor; and
   (iii) the sensor is a Hall sensor and wherein the sensor is formed in a substrate and the inner side of each of the first, second and third segments faces the sensing region.

10. The memory cell of claim 9, wherein the sensor is formed of a material that is compliant with a CMOS process.

11. The memory cell of claim 9 wherein the sensor is formed of a n-type region in said substrate.

12. The memory cell of claim 9 wherein the substrate is formed of silicon and wherein the sensor is formed by doping a region of the substrate.

13. The memory cell of claim 9 wherein the sensor is formed by doping said substrate with phosphorus.

14. The memory cell of claim 9 wherein a metal layer is formed between said magnetic element and said sensor.

15. The memory cell of claim 14 wherein said sensor and said metal layer form a diode for electrically isolating said magnetic element from said sensor.

16. The memory cell of claim 9 wherein the sensor has a current application line and a voltage measurement line and wherein the sensing region is defined by an intersection of said current application line and said voltage measurement line.

17. A memory cell comprising:
   (a) a magnetic element having a non-linear shape; and
   (b) a write line for storing a remnant magnetic field in said magnetic elements, a portion of the write line having a shape that corresponds to the non-linear shape of the magnetic element to completely cover the magnetic element.

18. The memory cell of claim 17 wherein said magnetic element has two or more segments, wherein said segments are not co-linear and wherein each of said segment stores a magnetic field.

19. The memory cell of claim 18 further comprising a sensor formed in a substrate and having a sensing region and wherein magnetic flux fields produced by each of said magnetic fields pass through said sensing region.

20. The memory cell of claim 19 wherein, in a first orientation, said magnetic flux fields pass through said sensing region in a first general direction and wherein, in a second orientation, said magnetic flux fields pass through said sensing region in a second general direction, wherein said first general direction is opposite to said second general direction.

21. The memory cell of claim 19 wherein each of said magnetic flux fields has a component that is normal to said sensing region.

22. The memory cell of claim 21 wherein, in a first orientation, said components of said magnetic flux fields pass through said sensing region in a first direction and wherein, in a second orientation, said components of said magnetic flux fields pass through said sensing region in a second direction.

23. The memory cell of claim 22 wherein said sensor is sensitive to said components of said magnetic flux fields to differential between said first and second orientations.

24. The memory cell of claim 23 wherein said sensor is sensitive to a cumulative effect of said components of said magnetic flux fields.

25. The memory cell of claim 17 wherein said magnetic element has two segments.

26. The memory cell of claim 18 wherein said magnetic element has three segments.

27. The memory of claim 18 wherein said magnetic element has five segments.

28. The memory cell of claim 18 wherein said magnetic element has six segments.

29. The memory cell of claim 17 wherein at least a portion of said magnetic element is curved.

30. The memory cell of claim 29 wherein said magnetic element has a semi-circular cross-section.

31. The memory cell of claim 29 wherein said magnetic element is an incomplete toroid.

32. The memory cell of claim 29 wherein said magnetic element stores a curved magnetic field.

33. The memory cell of claim 32 further comprising a sensor having a sensing region and wherein a magnetic flux field produced by said curved magnetic field passes through said sensing region.

34. The memory cell of claim 33 wherein, in a first orientation, said magnetic flux field passes through said sensing region in a first general direction and wherein, in a second orientation, said magnetic flux field passes through said sensing region in a second general direction, wherein said first general is opposite to said second general direction.

35. The memory cell of claim 33 wherein said magnetic flux field has components that is parallel to a direction normal to said sensing region.

36. The memory cell of claim 21 wherein, in a first orientation, said components of said magnetic flux fields pass through said sensing region in a first direction and wherein, in a second orientation, said components of said magnetic flux fields pass through said sensing region in a second direction.

37. The memory cell of claim 22 wherein said sensor is sensitive to said components of said magnetic flux fields to differentiate between said first and second orientation.

38. The memory cell of claim 19 wherein the magnetic element and the sensing region are substantially parallel.

* * * * *